United States Patent [19]

Safabakhsh et al.

[11] Patent Number: 4,850,780
[45] Date of Patent: Jul. 25, 1989

[54] PRE-PEEL DIE EJECTOR APPARATUS

[75] Inventors: Ali R. Safabakhsh, Lafayette Hills; Vincent G. Amorosi, Warminster, both of Pa.

[73] Assignee: Kulicke and Soffa Industries Inc., Willow Grove, Pa.

[21] Appl. No.: 101,842

[22] Filed: Sep. 28, 1987

[51] Int. Cl.$^4$ ............................................. B23P 21/00
[52] U.S. Cl. .................................. 414/417; 414/627; 221/74; 294/64.1; 29/740; 29/743
[58] Field of Search ............... 414/416, 417, 403, 404, 414/222, 225, 226, 787, 626, 627, 785, 786; 221/74; 271/104, 105, 106, 188; 29/740, 743; 156/344, 584; 294/64

[56] References Cited

U.S. PATENT DOCUMENTS

| | | |
|---|---|---|
| 3,720,309 | 3/1973 | Weir . |
| 3,973,682 | 8/1976 | Neff ...................... 414/627 |
| 4,494,902 | 1/1985 | Kuppens et al. ............ 221/74 X R |
| 4,703,965 | 11/1987 | Lee et al. ............... 294/64.1 |
| 4,728,135 | 3/1988 | Sugimura et al. .............. 294/64.1 |

FOREIGN PATENT DOCUMENTS

| | | | |
|---|---|---|---|
| 3217672 | 11/1983 | Fed. Rep. of Germany ........ 29/740 |
| 125950 | 4/1980 | Japan ............................ 29/743 |

Primary Examiner—Frank E. Werner
Attorney, Agent, or Firm—John B. Sowell

[57] ABSTRACT

A die ejector chuck is provided with a central housing and an outer housing and the central housing is provided with a die eject collar which extends through an aperture in the outer housing. A preselected die on a flexible adhesive tape is positioned over the die eject collar and a source of vacuum is applied to apertures in the outer housing. The outer housing is moved upward and away from the central die eject collar so as to stretch the flexible adhesive tape supporting the preselected die. The adhesive tape is pre-peeled and pulled away from the preselected die which subsequently is further separated from the adhesive tape by a die eject pin to permit the preselected die to be picked up with a die collet acting with a light pulling force on the active surface of the preselected die.

12 Claims, 5 Drawing Sheets

PRE-PEEL DIE EJECTOR APPARATUS

BACKGROUND OF THE INVENTION

1. Field of the Invention

The present invention relates to die ejector chucks and die-pick up collets for removing a die from a sawn wafer mounted on a flexible adhesive membrane. More particularly, the present invention relates to a chuck apparatus for peeling the flexible membrane from beneath the edges of a selected die on a wafer prior to picking up the die with a die collet.

2. Description of the Prior Art

Heretofore, manufacturers of semiconductor devices have employed several techniques to separate individual die (chips) from each other after being manufactured in wafer form. The wafers have been diamond scribed and broken to separate them one from another, but this presents problems of having to reorient the separated die for pick-up and also has caused damage when the individual die or chips rub against each other and damage the active surfaces.

It has been found that the above problems could be eliminated if the wafers were saw cut with precision diamond saws so as to isolate individual die by the width of the saw and leave the die mounted on an adhesive surface. When the adhesive holding force is small or negligible, it is possible to lift or pull the selected die off of the adhesive membrane carrier without damaging the die. As the chips size have increased in area during the manufacture of very large scale integrated (VLSI), the adhesive beneath the die increases in holding force resulting in the requirement of much higher pick-up forces. Die eject pins have been incorporated into die chucks and have been employed on the back side of the adhesive membrane to push the adhesive membrane opposite the pre-selected die while the die collet is contacting and pulling on the selected die on the opposite side. This reduces the amount of pull force required by the die collet to separate a die from the adhesive carrier. Such prior art die chucks are shown and described in co-pending application Ser. No. 855,099 filed Apr. 22, 1986 for "Apparatus For and Methods of Die Bonding" which is assigned to the same assignee as the present invention.

Die sizes have increased for large scale integrated circuits to the point that the adhesive force holding the die cannot consistently be overcome without causing some damage to the die being picked up. If the die eject force of the die eject pin becomes too great, the die collet can damage the active surface of the die. If the die eject force of the die eject pin is reduced to avoid the pinching force, the die has a tendency to pivot at the edge of the die where there is the greatest adhesive force and cannot be removed by the vacuum operated die collet because the die tilts and the vacuum pulling force of the die collet is reduced or lost.

It would be desirable to provide a die eject chuck which overcomes the above-mentioned problems and presents a selected die for pick-up using a convention die collet with a force so reduced as not to damage the active surface of the die.

SUMMARY OF THE INVENTION

It is a principal object of the present invention to provide a novel die eject chuck having a new mode of operation.

It is a principal object of the present invention to provide a novel die eject chuck which pre-peels the adhesive membrane carrier from the back of a selected die before the die is ejected and picked up with a die collet.

According to these and other objects of the present invention, there is provided a die eject chuck which has a central collar and a peripheral collar vertically movable relative to the central collar. The pre-selected die on a flexible adhesive membrane is positioned over the central collar and a source of high vacuum is applied to hold the outer edges of the membrane as the outer collar is moved upward and away from the central collar so as to stretch the membrane and the adhesive which support the die collet clamped pre-selected die. The adhesive membrane is stretched and pulled away from the back of the clamped pre-selected die so as to pre-peel the underlying adhesive membrane support for the die at which time a die eject pin is actuated to further strip the adhesive coated membrane from the back of the die and to permit a die collet to easily remove the die from the adhesive membrane.

DESCRIPTION OF THE PREFERRED EMBODIMENT

Figure 1:
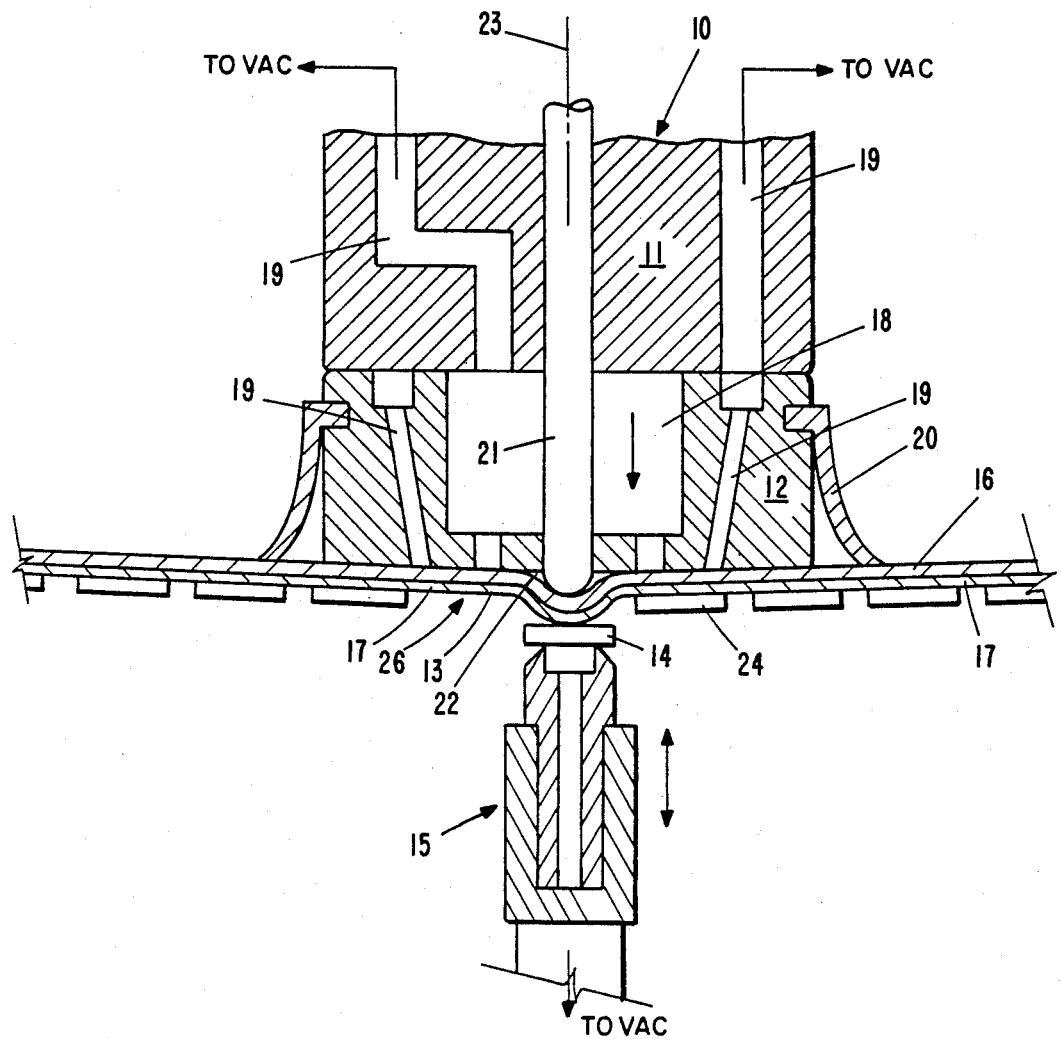
FIG. 1 is an enlarged elevation in section of a prior art chuck apparatus ejecting and extracting prior art size dies from an adhesive tape carrier.

Refer now to FIG. 1 showing a chuck apparatus of the type shown in Kulicke and Soffa Industries pending application Ser. No. 855,009. Chuck 10 comprises a support portion 11 to which chuck face 12 is attached. Such chuck faces are custom shaped to accommodate a particular die size that is to be ejected and extracted. The flat central area 13 of the die face is preferably made equal to or smaller than the smallest size of the die to be picked up. Similarly, the die collet or pick-up tool 15 has a working face which is smaller than the smallest side of the die 14. Pick-up tool 15 applies a force to die 14 to clamp the die before pick-up, but this force is insufficient to overcome the ejecting force which is exerted by eject pin 21.

The preferred sequence of operation of the chuck apparatus 10 is to position the chuck 10 over the pre-selected die 14 and to position the chuck downward to deflect the flexible membrane 16 which has an adhesive layer 17 thereon. The membrane 16 conforms to the profile of the face 12 of the chuck 10 and is held thereto by a high vacuum applied in vacuum passageways 18, 19 and contained within the vacuum shroud 20.

At the time the die eject pin starts to move downward as shown in FIG. 1, two forces are being applied to separate the adhesive layer 17 from the back of the die 14. The first force is a vertical force which is acting on the adhesive at the edge of the die that is created by the vacuum in the cavity 22 surrounding the die eject pin 21. The second force is caused by a strain in the membrane 16 resulting from the membrane 16 being stretched. Neither of these forces are symmetrical around the center line 23 of the die chuck pin 21. When the unbalanced condition shown in FIG. 1 occurs, and there is no adjacent die on one side but there is an adjacent die 24 on the other side, there is an unbalance of forces which causes large die to tilt and improper pick-up or no pick-up occurs.

Figure 2:
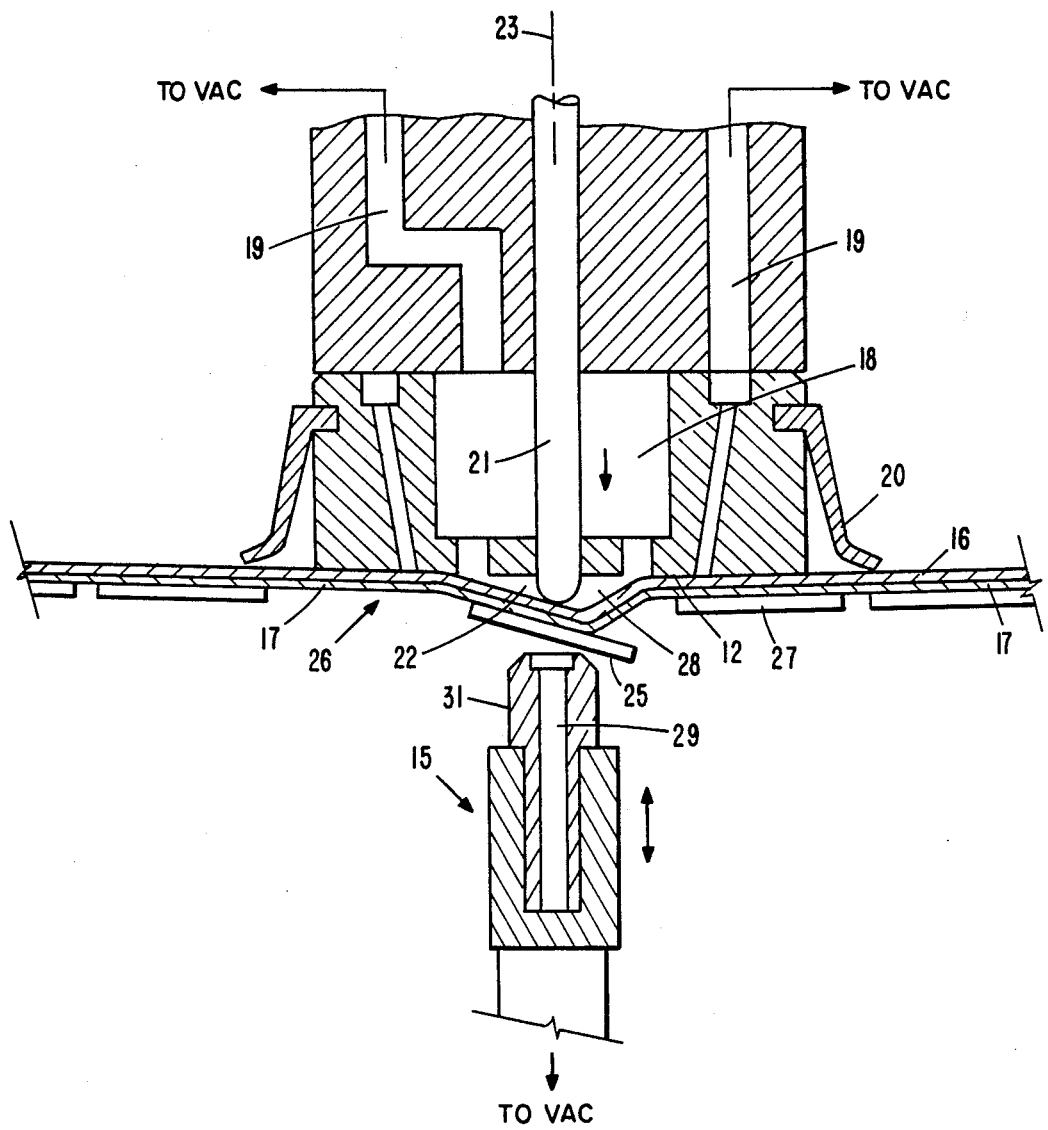
FIG. 2 is an enlarged elevation and section of the prior art chuck apparatus of FIG. 1 illustrating the malfunction which occurs when attempting to eject a large die before extraction occurs.

Refer now to FIG. 2 showing the same chuck apparatus 10 being employed to pick-up a large die 25 when the adjacent die space 26 to the left of the die 25 is empty and there is a die 27 in the adjacent die space to the right. The membrane area in the die space 26 is unrestrained and free to stretch over a large area while the membrane area under die 27 cannot stretch due to the adhesive restraint attachment to die 27. Since the membrane area 26 can stretch it is pulled by vacuum forces into contact with the profile of chuck face 12 as shown. Initially, when the die eject pin 21 separates the membrane 16 from the die face 12, the adhesive layer 17 is in contact with the full bottom surface of large die 25 as well as the adjacent large die 27 so that the cavity 28 extends under both die (dies) 25 and 27 before assuming the position shown in FIG. 2. The vacuum force that extends under both die 25 and 27 in cavity 28 creates a vertical upward force on both die 25 and 27, however, die 25 is held by die eject pin 21 while the adjacent die 27 is forced by atmospheric pressure in contact with the chuck face or profile 12 as shown in FIG. 2. The atmospheric force on die 27 causes the die 27 to pivot on its right most edge which results in a partial release of the adhesive on the right side of die 25. Unfortunately, this unsymmetrical release of forces tilts the die 25 so that the cavity 22 becomes even smaller. Now when the pick-up tool 15 attempts to pull die 25 from the adhesive layer 17, the vacuum passage 29 is not closed by die 25 and no pick-up force is applied to extract or pick-up die 25. The large die thus remains on the adhesive layer 17 in the position shown in FIG. 2 and the subsequent operation of the die bonder causes a malfunction because no die is placed on the package to which the die is to be attached.

A study of the forces acting on die 25 at the time of pick-up resulted in attempting to increase the downward force of the die collet 15 and an attempt to clamp and hold die 25 substantially horizontal while die eject pin 21 was moved with a larger force to the eject position shown in FIG. 2. Even though the die collet insert 31 was made of a resilient but hard material, the clamping or pinching force between eject pin 21 and die collet insert 31 was sufficient to cause damage to the active face of die 25 before being able to maintain the die in a horizontal position when picking up large die.

Figure 3:
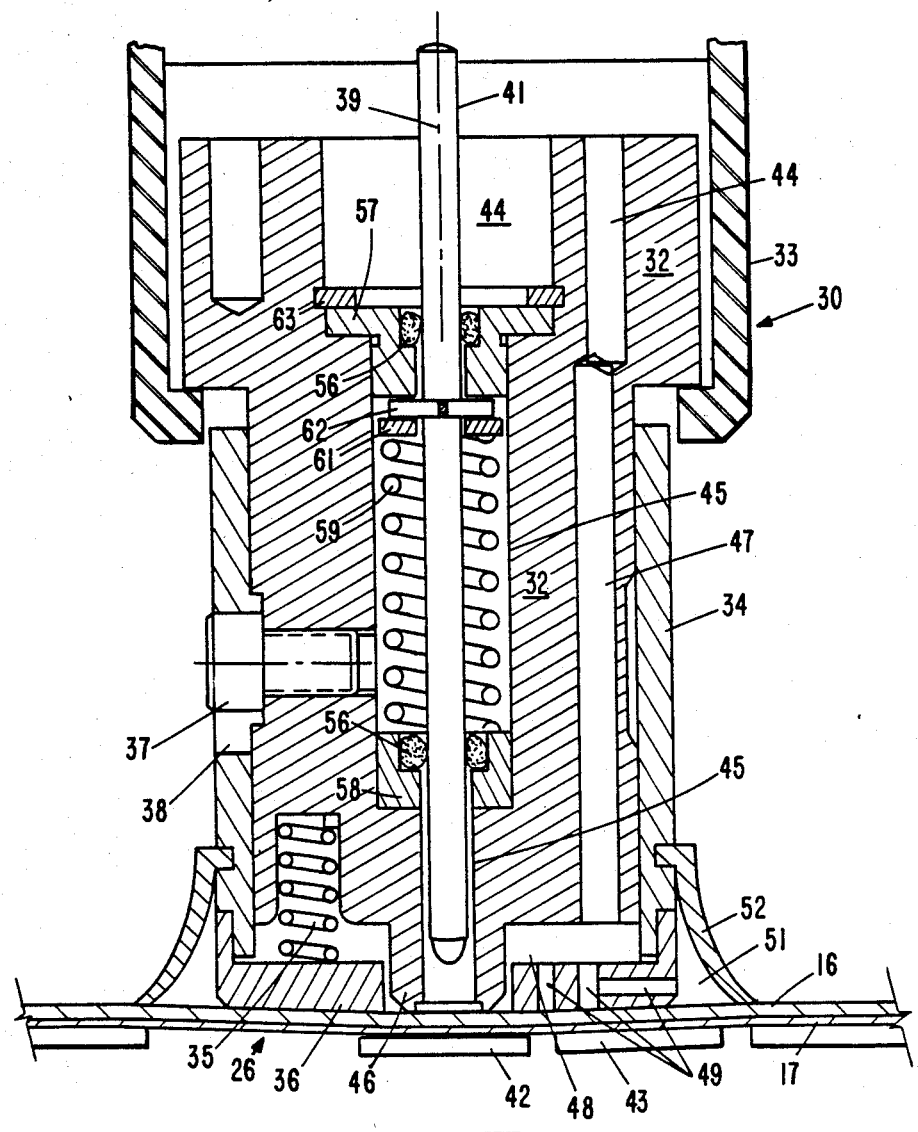
FIG. 3 is an enlarged elevation and section of the present invention chuck apparatus positioned opposite a large pre-selected die prior to ejecting and extracting the pre-selected die.
Figure 3:
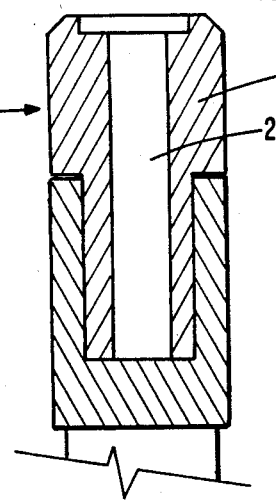

Refer now to FIG. 3 showing an enlarged cross-section view of the preferred embodiment of the present invention chuck apparatus 30. The central housing means 32 is mounted on a die bonder (not shown) by sleeve adapter 33. The outer housing means 34 is slidably mounted on central housing means 32. Outer housing 32 is spring biased by springs 35 and outer chuck face 36 to its extended position which is limited by cap screw 37 threaded into the side of central housing 32 and by guide slots 38 in the outer housing 34.

In the preferred embodiment shown, the flexible membrane 16 and adhesive 17 are holding the sawn dice of the wafer by their back surface with their active surfaces exposed and facing downward. The wafer could be mounted face up or facing sideways and would still employ the same structure and mode of operation to be explained hereinafter. The wafer and its support structure have a lower mass than chuck assembly 30 and the cooperating structure on the die bonder, so it is preferred that the wafer move relative to the apparatus 30 to position the pre-selected die 42 to be ejected and extracted (picked-up) directly over and centered on center line of die eject pin 39 which has a rounded or hyperbolic shaped point. In the position shown in FIG. 3, outer chuck face 36 is pressed against membrane 36 so as to deflect die 42 downward to a horizontal position and all adjacent die, such as die 43, are biased at a slight angle. No vacuum is being applied at passageway 44 and central guide shaft 45 which extends through the die eject collet 46 to membrane 16. A low vacuum is being applied to passageway 47 which extends to plenum 48 formed between the central housing 32 and the outer housing 43 and chuck face 36. The low vacuum is extended via apertures 49 to membrane 16 and the air space 51 inside of vacuum shroud 52.

Figure 4:
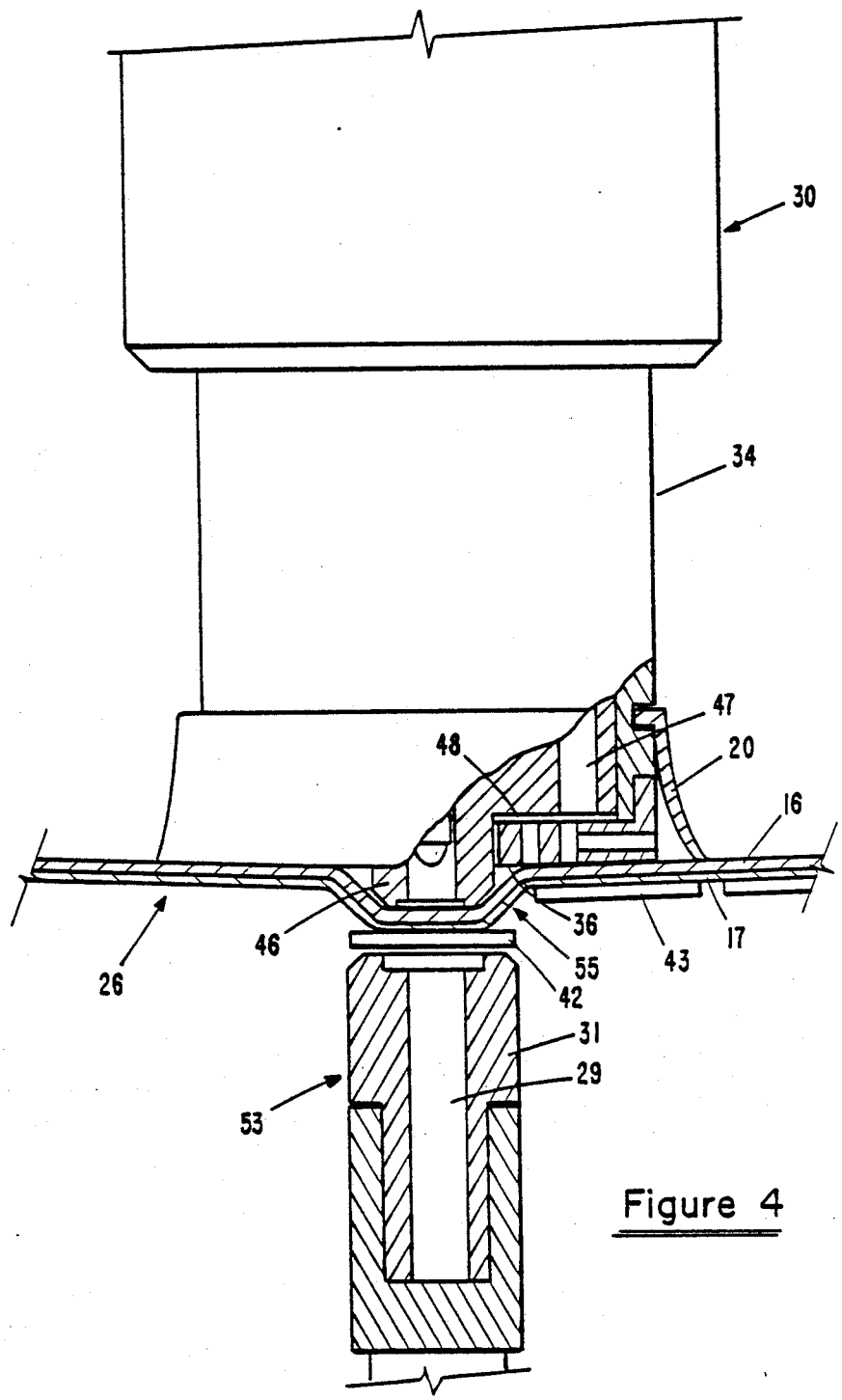
FIG. 4 is an enlarged elevation in partial section of the present invention chuck apparatus of FIG. 3 showing the novel pre-peeling step performed by the outer movable chuck collar.
Figure 5:
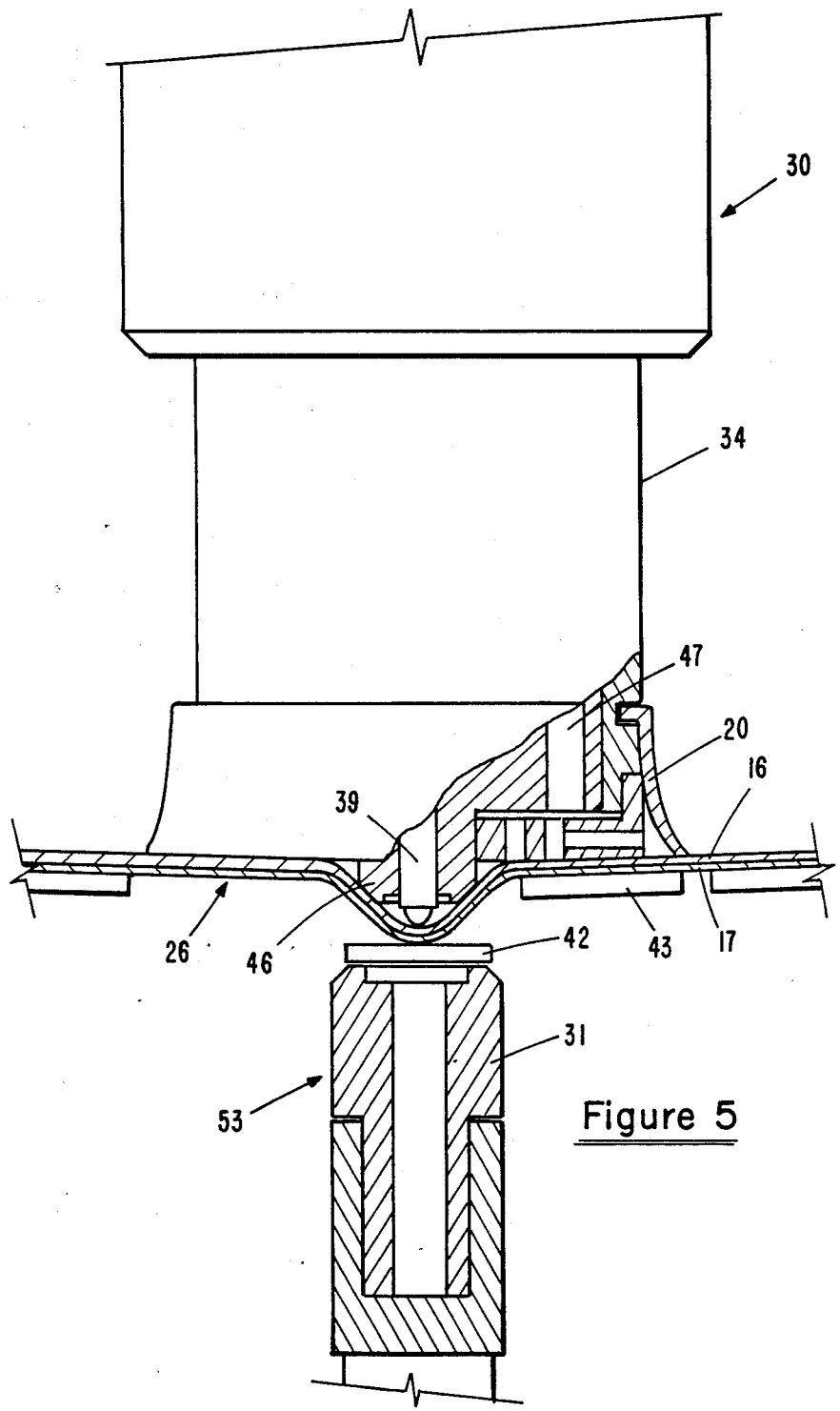
FIG. 5 is an enlarged elevation and partial section of the present invention chuck apparatus of FIGS. 3 and 4 showing the ejection of a pre-peeled die.

Refer now to FIGS. 3 to 5. FIG. 4 shows die collet or pick-up tool 53 clamping die 42 before outer chuck face 36 is moved to pre-peel the adhesive coated membrane 16 from the back of the die 42. When a high vacuum is applied to passageway 47 and plenum 48, it causes the outer chuck face 36 to move upward compressing springs 35 that are symmetrically positioned in a circle in central housing 32. Upward movement of chuck face 36 also moves the membrane areas adjacent to the clamped die 42 upward causing the adhesive coated membrane 16 to peel away from the edges of die 42 whether or not there is an adjacent die 43. Once the membrane 16 is pre-peeled from the back of clamped die 42 as shown in FIG. 4, die 42 is properly centered on die collet 53 and held by the vacuum in passageway 29 and the clamping force. Die eject collar 46 has not moved but chuck face 36 moves relative thereto which operably effects ejection or pre-ejection of die 42 from membrane 16. Die eject collar 46 is provided with a horizontal face area approximately one-half the size of the area of die 42 that is to be ejected. The sides of collar 46 are beveled to avoid interference with the offset pre-peel portion 55 of the membrane 16 in the pre-peel stage shown in FIG. 4.

After the adhesive 17 is pre-peeled from the back of the die 42, the die eject pin 39 is moved downward from the position shown in FIG. 3 to the position shown in FIG. 5 by an actuator (not shown) in the bonding machine. The actuator may be a linear motor which applies a desired force. Die eject pin 39 is guided by ring bearings 56 fitted in bearing collars 57 and 58. Spring 59 biases die eject pin 39 upward through washer 61 and split keeper ring 62 which bears on collar 57 that is held by split keeper ring 63.

Die eject pin 39 is shown in FIG. 5 its downmost or eject position extended from die eject collar 46. The movement of eject pin 39 exerts sufficient force to overcome the upward clamping or pinching force of the die collet or pick-up tool 53, thus, creates a final peeling of the membrane 16 from the reverse side of die 42. When the die collet 53 is now retracted downward, the adhesive force on the reverse side under the die 42 at the point of the die eject pin 39 is insufficient to prevent extraction by the die collet from the adhesive 17 on flexible membrane 16.

It will be understood that the movement of the outer housing 34 by vacuum means is a simplified and preferred embodiment and that the movement of housing 34 could be accomplished by mechanization and other means. Similarly, vacuum or pneumatic actuators could be employed to move die eject pin 39 which is shown being moved against the force of spring 59. The operation of the preferred embodiment of the present invention is thus not restricted to the mechanism used for moving the outer housing 34 relative to the die eject collar 46 before the die eject pin 39 completes the die eject operation so as to remove most of the adhesive coated flexible membrane 16 from the reverse side of the die 42 before extraction occurs. Further, the removing of the adhesive from the backside of die 42 permits the die 42 to be clamped or pinched without exerting large extraction pin forces which could puncture the membrane 16 and/or fracture the die 42 as occurred with the prior art mechanism. By employing a two-stage ejection and a single stage of pre-peeling the adhesive from the back of the die to be picked up, it is possible to control the area of the adhesive which is attached to the back of the die before pickup. Thus, it is possible to control the amount of pick-up force applied to the active surface of the die by vacuum pick-up as well as the forces necessary to hold the die 42 during pre-peeling when the pensing force is active. The present invention eliminates damage to large die during ejection and extraction operations and provides means for consistently picking up large die without the die shifting from its pre-aligned position prior to pick-up which position controls the actual bonding position of the die which is bonded relative to its carrier or container.

What we claim is:

1. Chuck apparatus for partially removing large die from a sawn wafer attached to the adhesive side of a flexible film comprising:
   central housing means,
   die eject collar means extending outward from said central housing means,
   a guide shaft extending through said central housing means and said die eject collar means,
   a die eject pin mounted in said guide shaft and adapted to be moved therein,
   outer housing means mounted on said central housing for movement relative thereto,
   a central aperture in said outer housing means around said die eject collar,
   vacuum passageway means extending through said outer housing means and means to produce a vacuum therein so that a potion of said die eject collar means is extended from said outer housing to engage the backside of said adhesive film under the extended lateral edges of said large die,
   means for actuating said outer housing means to extend said die eject collar through said aperture whereby the adhesive film is stretched and peeled from beneath said large die along said extended lateral edges to expose and isolate said die from surrounding die o said wafer, and
   means for actuating said die eject pin to push said selected die away from the adhesive on said flexible adhesive film during pick-up.

2. Chuck apparatus as set forth in claim 1 wherein said outer housing means is coaxially mounted on said central housing means.

3. Chuck apparatus as set forth in claim 1 wherein said die eject pin is spring loaded to a retracted position in said guide shaft.

4. Chuck apparatus as set forth in claim 3 wherein said die eject pin is mounted in ring bearings.

5. Chuck apparatus as set forth in claim 4 wherein said die eject pin is moved by a controlled force linear motor.

6. Chuck apparatus as set forth in claim 1 wherein said outer housing means is supported on said central housing means and spring biased to an extended position wherein the top of said die eject collar means and the face of said outer housing form a continuous smooth surface for engaging a preselected die.

7. Chuck apparatus as set forth in claim 6 which further includes an aperture in the sidewall of said outer housing and further includes a capscrew extending through said aperture into said central housing means for determining the normal position of said outer housing means relative to said central housing means.

8. Chuck apparatus as set forth in claim 1 which further includes a vacuum shroud mounted on said movable outer housing means.

9. Chuck apparatus as set for in claim 8 wherein said vacuum shroud surrounds said movable outer housing means.

10. Chuck apparatus as set forth in claim 1 wherein said vacuum passageway means extend axially through the top of said outer housing means.

11. Chuck apparatus as set forth in claim 10 which further includes vacuum holes extending through said outer housing means at a position beyond said extended lateral edges of said die.

12. Chuck apparatus as set forth in claim 11 which further includes crossbore vacuum holes extending radially outward to the side walls of said outer housing means.

* * * * *